United States Patent [19]

Eichelberger et al.

[11] 4,290,052
[45] Sep. 15, 1981

[54] CAPACITIVE TOUCH ENTRY APPARATUS HAVING HIGH DEGREE OF PERSONAL SAFETY

[75] Inventors: Charles W. Eichelberger, Schenectady; Robert J. Wojnarowski, Clifton Park, both of N.Y.

[73] Assignee: General Electric Company, Schenectady, N.Y.

[21] Appl. No.: 88,287

[22] Filed: Oct. 26, 1979

[51] Int. Cl.³ .......................... G06F 3/02; H01G 7/00
[52] U.S. Cl. .......................... 340/365 C; 200/DIG. 1; 361/280; 361/330
[58] Field of Search ............ 340/365 R, 365 C, 365 S; 200/DIG. 1, 52 R; 400/479.1; 361/288, 280, 292, 300, 330; 364/705; 178/17 C, 18; 179/90 K; 235/145 R; 307/116

[56] References Cited

U.S. PATENT DOCUMENTS

| | | | |
|---|---|---|---|
| 3,757,322 | 9/1973 | Barkan et al. | 340/365 C |
| 3,921,167 | 11/1975 | Fox | 340/365 C |
| 3,951,250 | 4/1976 | Pointon et al. | 400/479.1 |
| 3,974,332 | 8/1976 | Abe et al. | 340/365 C |
| 4,055,755 | 10/1977 | Nakamura et al. | 340/365 C |
| 4,123,631 | 10/1978 | Lewis | 340/365 C |

FOREIGN PATENT DOCUMENTS 0814077  5/1969  Canada ......................... 340/365 C Primary Examiner—James J. Groody
Attorney, Agent, or Firm—Geoffrey H. Krauss; James C. Davis; Marvin Snyder

[57] ABSTRACT

A capacitive touch entry structure utilizes an array of at least one capacitive touch sensor fabricated upon a double-sided printed circuit board adhesively mounted upon a surface of a transparent insulative substrate. The substrate has sufficient thickness to safely insulate user personnel, contacting the substrate surface furthest from an electrode of the capacitive touch sensor, from electrical potentials present adjacent to the panel surface upon which the capacitive touch sensor is fastened. Touch sensor circuitry and interconnections may be advantageously fabricated directly upon the pair of conductive planes, sandwiching an insulative layer therebetween, to form the printed circuit portion of the structure. A conductive guard may also be disposed adjacent to the substrate to shield at least the lead portions of the touch sensors from capacitive effects.

8 Claims, 6 Drawing Figures

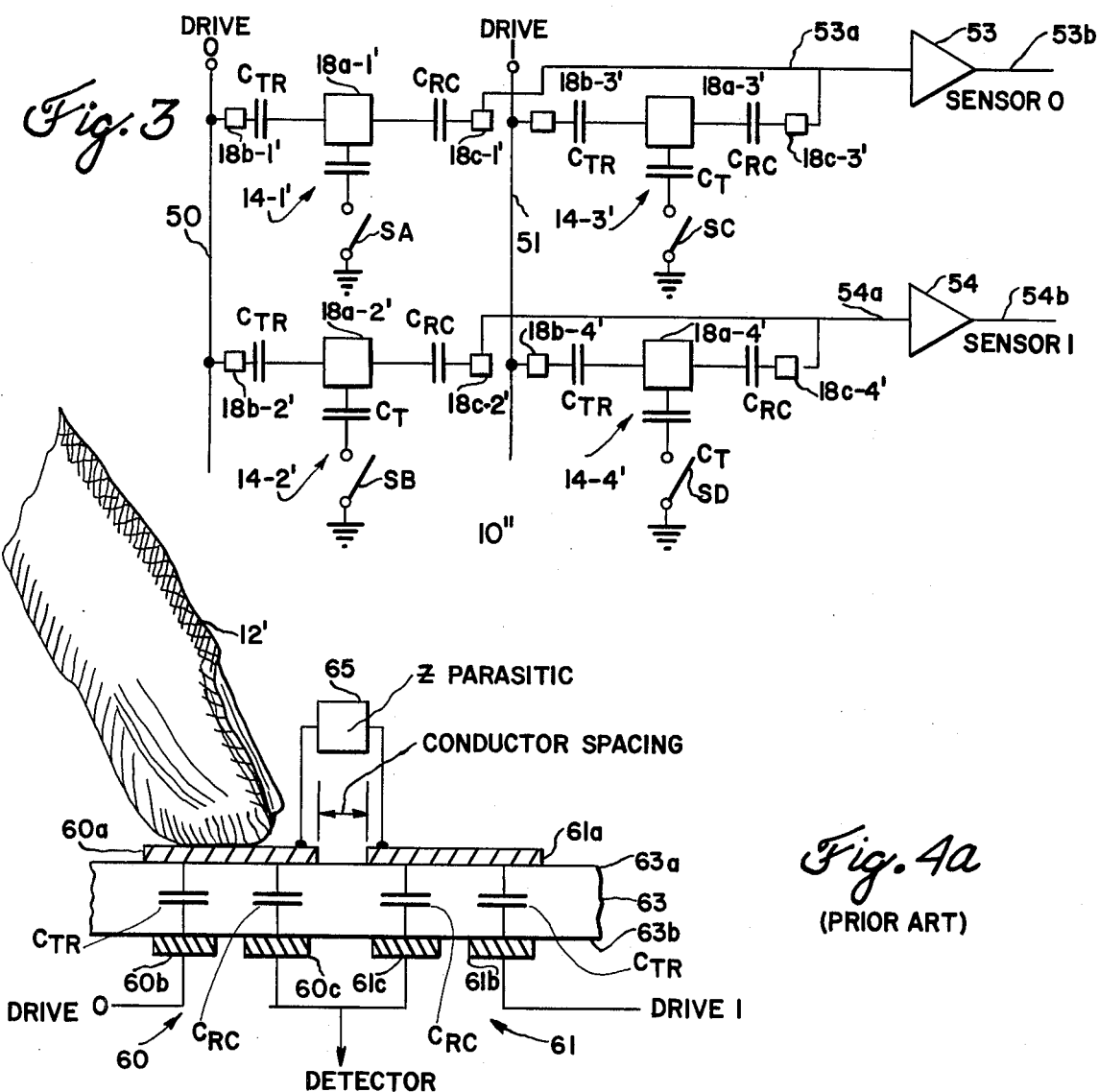
Fig. 3
Fig. 4a (PRIOR ART)
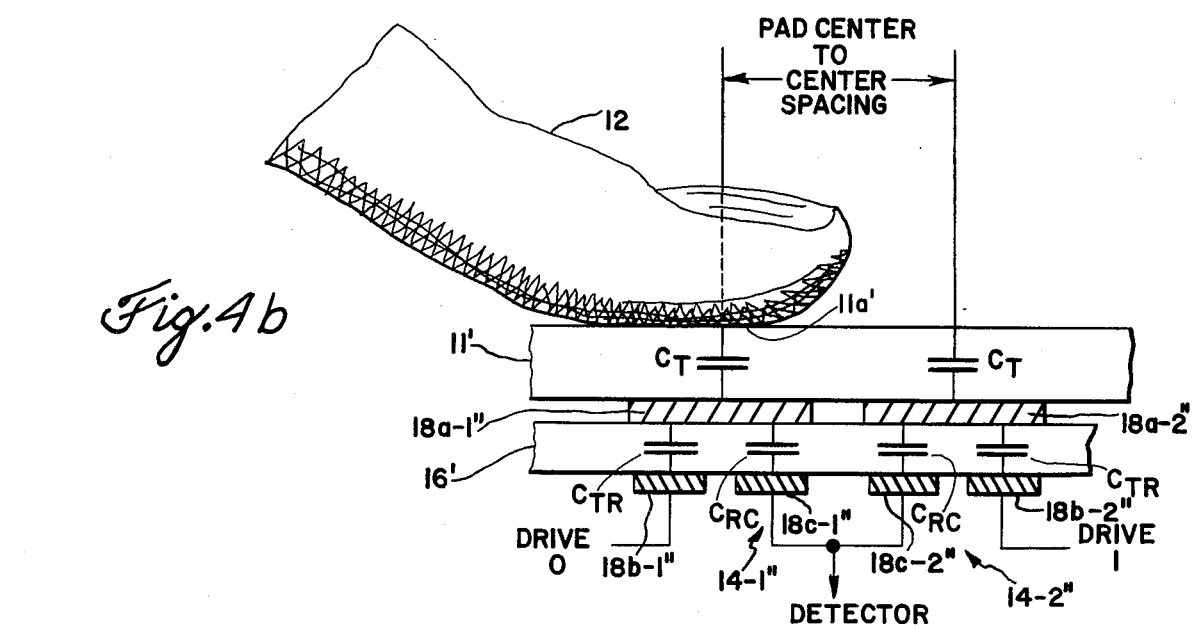
Fig. 4b

CAPACITIVE TOUCH ENTRY APPARATUS HAVING HIGH DEGREE OF PERSONAL SAFETY

BACKGROUND OF THE INVENTION

The present invention relates to capacitive touch entry structures and more particularly to a structure allowing capacitive touch entry of data while providing a high degree of safety to user personnel.

It is known to provide arrays of at least one conductive touch pad sensor for controlling functions of an apparatus by contact of a portion of the user's personnel, such as a user's fingertip, to a touch contact area. Conventional touch entry systems utilize a matrix of electrodes overlayed by an insulating film, such as a plastic membrane and the like, to allow the electrode to be pressed against contacts by user's finger, while preventing direct contact with the electrode. The insulative plastic membrane allows a low impedance path between a pair of contacts to be made, and also prevents application of touch contact potentials to the user's finger, but is of insufficient insulative thickness to prevent application of higher potentials if such higher potentials appear on the touch contact due to improper generations of the apparatus to be controlled by the touch sensors. This form of touch entry structure exhibits several difficiencies, including: a plastic appearance; a high probability of damage during cleaning (which may allow touch pad potentials to be received by user personnel); and low possibility of integration with display apparatus due to the insufficient clarity of a plastic membrane for allowing the display information to appear in areas directly adjacent to the capacitive touch pad area.

A suggested solution to the problem is to fabricate capacitive touch sensors having touch pad electrodes fabricated upon a glass substrate. The use of a glass substrate generally requires some form of conductive elements upon the front surface of the substrate, which is that surface directly contacted by the user's finger. Thus, not only is the user receiving some portion of the voltage potential utilized to operate the sensor (which is undesirable from a safety viewpoint) but this form of capacitive touch pad also requires the extremely expensive processing step associated with depositing a front substrate conductor and is also incompatible with the processes utilized for tempering the glass substrate for safety reasons. Additionally, the front electrode must be of a transparent conductive material and tends to show fingerprints more readily than a glass substrate having no front substrate conductor; the presence of a front substrate conductive film allows that film to be interrupted, as by the presence of scratches and the like, whereby the capacitive touch sensor utilizing that electrode will fail.

Accordingly, it is desirable to provide a capacitive touch entry panel structure having capacitive touch entry sensors so positioned as to provide a high degree of user safety and sensor reliability, with low manufacturing costs therefor.

BRIEF SUMMARY OF THE INVENTION

In accordance with the invention, a capacitor touch entry panel having a high degree of user personnel safety is fabricated by positioning an array of capacitive touch sensors upon the opposite surface of a high-dielectric-constant member having a remaining surface contactable by user personnel for individually activating the capacitive touch sensors. The sensor array is formed of an insulative layer supporting patterned conductors upon the opposite sides thereof, with the conductor patterns forming the electrodes of the various sensors of the array. That conductor-bearing surface of the insulative sheet, having the "touchable" electrodes of the sensors, is fastened to the insulative substrate surface furthest from the contactable surface. Electrical components, of passive or active nature, and interconnection leads may be fabricated as an integral part of the conductor patterns on either or both surfaces of the insulative layer, to reduce the number of contacts required to be made to the capacitive touch entry panel.

In one presently preferred embodiment, the insulative layer and its pair of patterned conductive planes is fabricated of a sheet of double-sided printed circuit board. The printed circuit board contains an array of touch pads, each having a "touch" electrode formed in the conductor material on a first side thereof and having transmitter and receiver electrodes in registration therewith and fabricated upon the opposite side of the printed circuit board. The conductive sheet surface of the printed circuit board having the "touch" electrodes, is adhesively fastened to the surface of the transparent, insulative substrate (formed of glass and the like) opposite that surface contactable by user personnel. The substrate may be formed of tempered glass of a sufficient thickness to meet user personnel safety requirements, with the high dielectric constant of the substrate material causing a finger "touch" to appear to the "touch" electrode as being closer, by a factor equal to the dielectric constant of the substrate material, than it actually is. In this manner, conductors upon the front surface, or within the volume, of the protective insulative substrate are not required and touch pad intercoupling is reduced as there are no closely spaced touch pad edges which can be coupled together by contamination of the touchable front surface of the insulative substrate.

Accordingly, it is an object of the present invention to provide a capacitive touch entry panel having an array of capacitive touch sensors isolated from user personnel contact.

This and other objects of the present invention will become apparent upon consideration of the following detailed description, when taken in conjunction with the drawings.

BRIEF DESCRIPTION OF THE DRAWINGS

FIG. 3 is a schematic diagram illustrating one possible embodiment of a circuit for driving a matrix of capacitive touch sensors forming a portion of the capacitor touch entry panel of the present invention; and FIGS. 4a and 4b are sideviews of portions of a prior art capacitive touch sensor structure and of the touch entry panel of the present invention, respectively, illustrating the relative responses to contamination and the like deleterious effects.

DETAILED DESCRIPTION OF THE PRESENT INVENTION

Figure 1A:
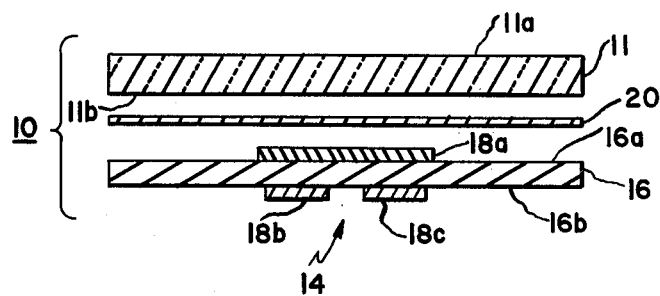
FIG. 1a is an exploded sideview of a capacitive touch entry panel in accordance with the principles of the present invention.

Referring now to FIG. 1a, a capacitive touch entry panel 10 comprises a substrate, or panel, 11 of a transparent insulative material, such as glass and the like. A first surface 11a of the panel is contactable by a portion, such as finger 12 (FIG. 1b), of user personnel. An array of at least one capacitive touch sensor 14 is fabricated upon an insulative material layer 16. The various electrodes 18 of the capacitive sensor are deposited upon the surfaces 16a and 16b of layer 16.

In the presently preferred embodiment, each sensor 14 includes a somewhat rectangular-shaped "touch" electrode 18a, fabricated upon that surface 16a of the insulative layer nearest to the surface 11b of the panel, which surface 11b is not subject to contact by user personnel digit 12. A pair of spaced-apart transmitter and receiver electrodes 18b and 18c, respectively, are fabricated upon the insulative layer surface 16b furthest from the panel and so registered with "touch" electrode 18a as to be within an area bounded by the periphery of electrode 18a. The insulative layer 16, bearing conductive electrodes 18 upon both surfaces 16a and 16b thereof, is fastened to rear surface 11b of the substrate by means of a suitable adhesive strip 20 and the like. The insulative adhesive strip 20 may be replaced by other fastening means, which may be characterized by the dual qualities of fastening the electrode-bearing insulative layer 16 to the panel rear surface and providing an insulative barrier between "touch" electrodes 18a of adjacent sensors. It should be understood that a plurality of sensors 14 may each be fabricated of at least two electrodes, positioned upon either or both surfaces of insulative layer 16, and may extend in an array leftwardly and rightwardly, and into and out of the plane of the drawing, or may be otherwise arranged about the two-dimensional plane of insulative layer 16, and substantially parallel to the rear surface of insulative substrate 11.

Advantageously, sensors 14 are fabricated upon insulative layer 16 by utilization of printed circuit board (PC board) of the double-clad variety, having a layer of insulative material sandwiched between two planes of conductive material; the desired sensor pattern is formed upon each of the conductor planes and the unwanted conductor of each plane is subsequently etched away. This has the further advantage that interconnection lines between electrodes of various sensors may be interconnected by conductive leads fabricated as a portion of the PC board, as is well known to the art. A further advantage allows electronic components, of either the passive or active types, to be installed directly upon the appropriate portions of the double-sided printed circuit board, prior to cementing the printed circuit board to the rear of panel substrate 11.

Figure 1B:
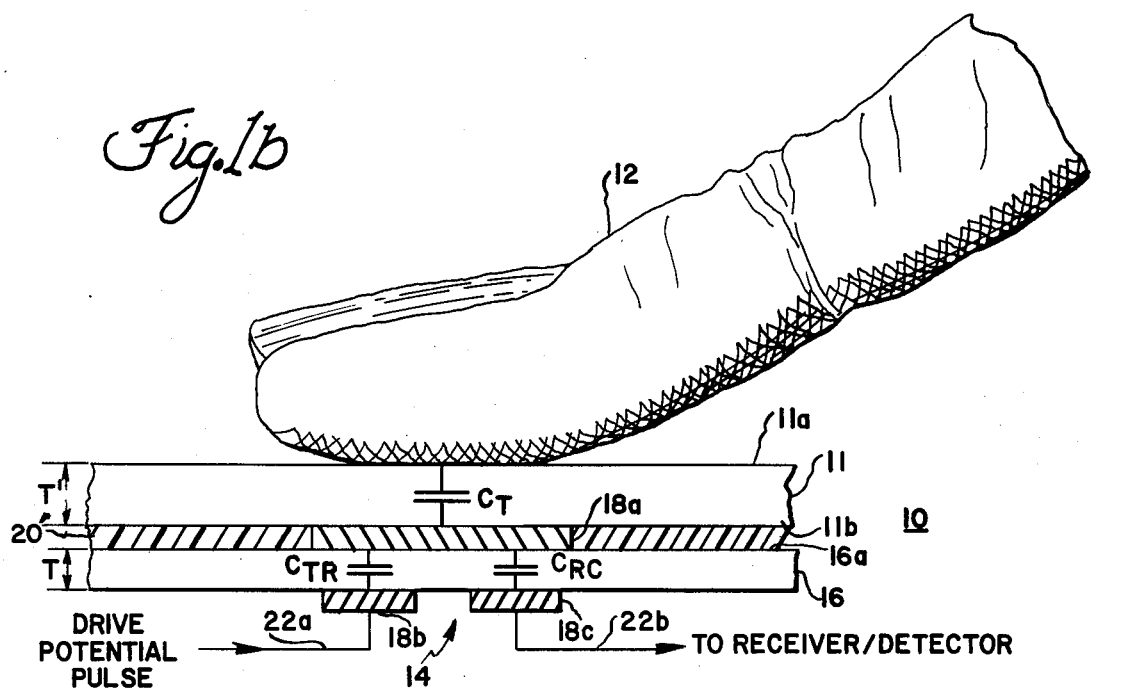
FIG. 1b is a sideview of a portion of a capacitive touch entry panel, illustrating the manner of operation thereof.

As shown in FIG. 1b, in operation, the capacitive touch entry panel 10 is provided with a driving signal to a lead 22a connected to transmitter electrode 18b. The drive potential, typically a pulse voltage, is coupled from a source (not shown) across insulative layer 16 from transmitter electrode 18b to touch electrode 18a; the coupling capacitance $C_{TR}$ is a function of the area of transmitter electrode 18b and the thickness T and dielectric constant of the insulative layer 16. In the "no-touch" condition (with user personnel digit 12 removed) the signal coupled, at a "no-touch" amplitude, to touch electrode 18a is coupled, via capacitance $C_{RC}$, to receiver electrode 18c and thence via a lead 22b to appropriate detecting circuitry (not shown).

When user personnel digit 12 is in contact with front surface 11a of the panel, a touch capacitance $C_T$ is formed between touch electrode 18a and ground potential. This is the capacitance-to-ground of the user's body, in series with the capacitance of the area of that portion insulative panel 11 contacted. As the thickness T' of panel 11 may be relatively large, typically on the order of ⅛" to meet various safety requirements, the high dielectric constant of a glass panel, with typical dielectric constant of about 6 to about 8, makes the capacitance-to-ground of digit 12 appear to be closer to panel rear surface 11b, and touch electrode 18a, by a factor equal to the dielectric constant. Thus, a ⅛" thick panel of glass having an effective dielectric constant of 8 appears to provide an equivalent air gap of about 1/64th of an inch between digit 12 and touch electrode 18a. The drive potential pulse characteristics and the areas and spacings of electrodes 18a, 18b and 18c are coordinately preselected such that the presence of digit 12 at the equivalent air gap distance from touch electrode 18a provides the touch capacitance $C_T$ to ground. The touch sensor 14 now appears to be a T-type capacitive attenuator and the peak amplitude of a signal provided at receiver electrode 18c to the detector (not shown) will decrease with respect to the peak amplitude, at receiver electrode 18c, in the no-touch condition. This reduction in amplitude indicates the touch condition and may be suitably processed, by means known to the art, to effect control of other apparatus associated with the particular touch sensor 14.

The capacitive touch entry panel is particularly advantageous in that insulative panel 11 is fastened to the sensor-carrying printed circuit board in a final fabrication step, whereby the glass material of panel 11 may be separately tempered without subjecting the other portions of the panel to the tempering process. The use of relatively thick and tempered glass is required by various safety agency rules to not only reduce the possibility of panel breakage, but also to provide sufficient insulative thickness to protect user personnel from potentially hazardous operating potentials carried by wires behind the panel.

In conjunction with FIG. 1a, it should be noted that fastening means, such as a film 20' of cement, adhesive and the like, can be placed (FIG. 1b) between those portions of insulative layer surface 16a devoid of conductive material and portions of panel rear surface 11b in registration therewith, whereby the forward surface of touch electrode 11a abuts directly against panel rear surface 11b, with no adhesive means intervening therebetween.

Figure 2:
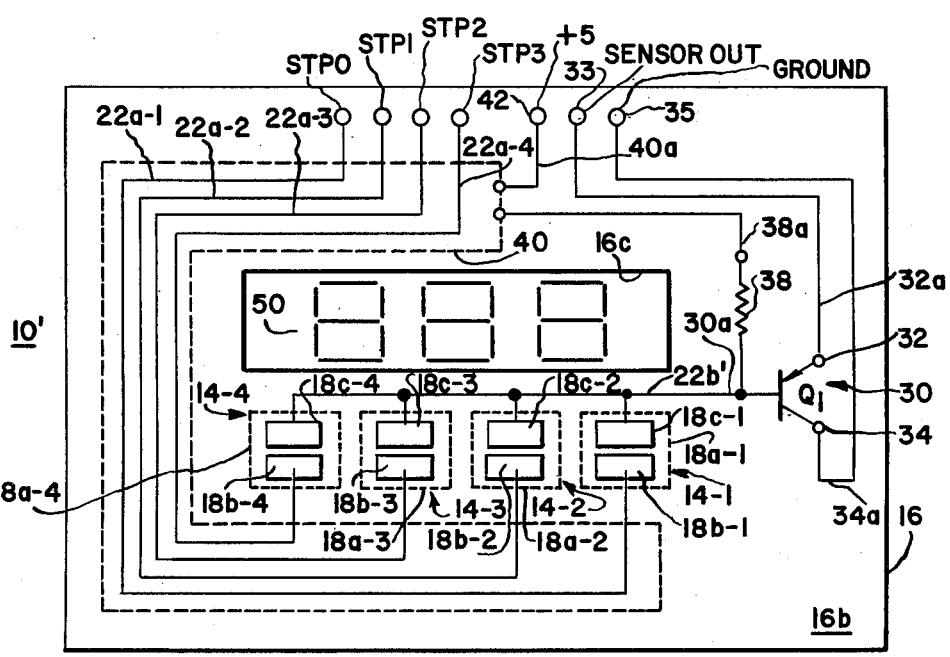
FIG. 2 is a plan view of a double-conductor-bearing insulative layer utilized in one example of a capacitive touch entry panel, and having display elements associated therewith.

Referring now to FIG. 2, an insulative layer 16' of one exemplary embodiment of our capacitance touch entry panel is shown, as viewed from the rear surface 16b thereof. Positioned upon the rear surface are the transmitter electrodes 18b-1 through 18b-4 and the receiver electrodes 18c-1 through 18c-4 of a set of four capacitive touch sensors 14-1 through 14-4. Shown in broken line are the touch electrodes 18a-1 through 18-4, fabricated upon the opposite surface of the dielectric layer. It should be understood that the plurality of capacitive touch sensors need not be arranged in an array elongated only a single direction, as shown for purposes of illustration.

Each of transmitter electrodes 18b-1 through 18b-4 is connected to an associated sensor transmitter pulse input terminal STP0 through STP3 by a respective one of leads 22a-1 through 22a-4, fabricated upon near surface 16b. All of receiver electrodes 18c-1 through 18-4 are coupled in parallel by a common lead 22b' to an input 30a of a sensor array detector 30. The detector includes a transistor $Q_1$ illustratively having its base electrode connected to detector input 30a, its emitter electrode 32 connected by a lead 32a to a sensor output terminal 33, and a collector electrode 34 connected via a lead 34a to a ground terminal 35. A base resistor 38 is connected between the base electrode of transistor $Q_1$ and a lead 38a. The lead 38a connects to a conductive guard electrode 40 which is in registration with all of sensor transmitter leads 22a-1 through 22a-4 and is also connected by a lead 40a to an operating potential input 42. Guard electrode 40 is so positioned as to shield leads 22a-1 through 22a-4 from capacitive effects when the surface of the capacitive touch entry panel is touched by user personnel digits, in the areas in registration with the leads, thus reducing the possibility of false touch indications. It should be noted that all of leads 22a-1 through 22a-4, 22b', 32a, 34a, 38a and 40a, as well as guard electrode 40 and the transmitter and receiver electrodes are all fabricated by etching a conductive planar member fabricated on rear surface 16b of the insulative layer. Resistor 38 may be a thin or thick film resistor subsequently deposited between an end of lead 38a and lead 22b', or may be a discrete resistance component positioned against insulative layer rear surface 16b and fastened between leads 38a and 22b', by soldering, welding and the like. Similarly, transistor Q1 may be a discrete, packaged transistor having its electrodes fastened to leads 22b', 32a and 34a after the transistor is positioned against the insulative layer rear surface.

Insulative layer 16 contains a cutout 16c for allowing displays 50, positioned behind the insulative layer rear surface 16b, to be viewable through the transparent panel 11. Advantageously, the information viewable on displays 50 is related to data entered via the capacitive touch sensors 14-1 through 14-4 of the capacitive touch entry panel 10'.

Referring now to FIG. 3, a panel 10" having a square array of four capacitive touch sensors 14-1' through 14-4' thereon is illustrated. The transmitter electrodes 18b-1' and 18b-2' of the first and second sensors are connected to a first drive line 50, while the transmitter electrodes 18b-3' and 18b-4', respectively, of sensors 14-3' and 14-4' are connected in parallel to a second drive line 51. First and second drive lines 50 and 51 are alternately driven with pulsed drive signals DRIVE 0 and DRIVE 1, respectively. The receiver electrodes of sensors similarly positioned along each of the first and second drive lines are connected in parallel to the input of a first detector 53, e.g. receiver electrodes 18c-1' and 18c-3' of sensors 14-1' and 14-3', respectively, positioned along one row of the square matrix, are connected to the input 53a of sensor 53. Similarly, the receiver electrodes of the sensors along a second row of the sensor array or matrix, e.g. receiver electrodes 18c-2' and 18c-4' of sensors 14-2' and 14-4', respectively, are connected to the inputs 54a of a second detector 54, and so on throughout the array. It should be understood that a multiplicity of sequentially driven drivelines may be utilized, with each driveline forming a column of an array, and with another multiplicity of detectors receiving the output of each row of the array of sensors.

Operation of the capacitor sensor matrix of panel 10" may be best understood by considering a switch to be located between ground potential and the contactable surface of substrate 11 over the touch electrode of each sensor. Thus, switches SA through SD are respectively associated with respective touch electrodes 11a-1' through 18a-4' of sensors 14-1' through 14-4', respectively. In the no-touch condition, the user's digit does not contact the substrate surface and the associated switch is open whereby the drive signals appear in sequence on the sequentially arranged drivelines, e.g. DRIVE 0 pulses appear on line 50, then DRIVE 1 signals appear on line 51, etc. The signals pass through the capacitances $C_{TR}$ and $C_{RC}$, to the associated detectors 53 and 54, for sensors 14-1' and 14-2', when drive line 50 receives the DRIVE 0 pulse. Relatively high amplitude signals appear at the respective detector inputs and are detected to provide a first level at the detector outputs 53b and 54b, respectively, as output signals SENSOR 0 and SENSOR 1, respectively. When any sensor is activated, by touching of the substrate front surface associated therewith, the equivalent switch is closed. Thus, if sensor 14-1' is in the touch condition, switch SA is closed and the touch capacitance $C_T$ thereof is coupled to ground potential, whereby the T-type capacitive voltage divider reduces the pulse magnitude present, when a DRIVE 0 pulse is present on driveline 50, whereby the detector signal magnitude is reduced. A second detector output magnitude, at the detector output associated with the row of that sensor touched, obtains, indicating to external circuitry (not shown) that the sensor has been touch activated. Additional details as to operation of capacitive touch sensor arrays, and of a self-optimizing touch pad sensor circuit which may be utilized therewith, is described in U.S. Pat. No. 4,145,748, issued Mar. 20, 1979, assigned to the assignee of the present invention and incorporated herein by reference. This multiplexing scheme, which may have nine or more column drivelines and nine or more row detectors, is highly advantageous and the high level of multiplexing is made possible with our capacitive touch entry panel due to the accurate control of the transmitting and receiving capacitors of each sensor engendered by the fabrication of the sensors on double-sided printed circuit board and the like, with all of the capacitors associated with a particular detector having substantially the same relative balance and therefore not requiring further trimming or multiple detector thresholds in order to establish which sensor touch electrode is contacted when the drivelines are sequentially scanned. Also, the use of a guard electrode (electrode 40 of FIG. 2), while not specifically shown in the schematic diagram of FIG. 3, substantially prevents parasitic coupling from the driveline to the touch and receiving electrodes. The use of this guard electrode is especially important, because the dielectric constant of the substrate is substantially greater than the dielectric constant of air.

Elimination of parasitic coupling, by use of the guard electrode, causes substantially only the transmit and receive capacitances $C_{TR}$ and $C_{RC}$ to be present in each sensor. Also, the guard electrode substantially reduces radio frequency interference effects which may occur due to the presence of high-voltage, fast-rise-time pulses on the relatively long drive lines, which drive lines may otherwise act as radiating antennas without the presence of the guard electrode.

Referring now to FIGS. 4a and 4b, a prior art capacitive sensor panel (FIG. 4a) is compared to a capacitive touch entry panel (FIG. 4b) of the present invention. In the prior art embodiment, a pair of adjacent sensors 60 and 61 each have a contactable touch electrode 60a and 61a fabricated upon the front surface 63a of an insulative substrate 63. Transmitter electrodes 60b and 61b and receiver electrodes 60c and 61c, respectively, of sensors 60 and 61, are fabricated upon the substrate rear surface 63b. Thus, touch electrodes 60a and 61a are directly contactable by user personnel digit 12'. In the touch entry panel of the present invention the transmitter electrodes 18b-1" and 18b-2", and the receiver electrodes 18c-1" and 18-c2", of respective sensors 14-1" and 14-2", are upon the rear surface of insulative layer 16', while the "touch" electrodes 18a-1" and 18a-2", respectively, are not directly contactable by personnel digit 12, due to the interposing of insulative substrate 11a therebetween. The touch entry panel of the present invention allows for reduced sensor touch electrode area, with respect to the area of the contactable touch electrodes of the prior art embodiment of FIG. 4a, due to the ability to mount the detector circuitry in very close proximity to the sensor capacitors, with consequent substantial reduction of parasitic capacitance, and also due to the fact that there is no advantage to having touch pads any larger than the area normally associated with the touching portion of the digit, whereby touch-pad areas of about one-half inch square are utilizable.

Due to the contactable nature of the touch pad electrode 60a and 61a of the prior art apparatus, relatively large spacings therebetween is required. That is, if the front surface 63a of the insulator substrate is covered with water or detergent and the like, as often happens with appliances (wherein touch pad sensors are often utilized), the increase in dielectric constant due to the water, or the conductive effects due to surface contamination, will form a parasitic impedance ZPARASITIC 65 or lesser magnitude than if contamination effects were not present, and increase the coupling between adjacent touch electrodes. The parasitic impedance problem requires that the sheet resistivity of the insulative member 63 be relatively high, as the magnitude of the parasitic impedance is affected by the spacing between the touch pad conductor edges and not the center-to-center spacing of the contactable touch electrodes themselves. Accordingly, in the prior art embodiments, the conductor spacing had to be relatively large to reduce the intersensor coupling via the parasitic impedances 65. In the present invention, parasitic impedance effects only occur if surface contamination initially makes contact at the point upon the front surface 11a' of the insulative substrate at which a finger touches the substrate, and also provides a complete conducting sheet, of sufficiently low conductivity, to cause a parasitic impedance to be formed over the area above an adjacent touch sensor touch electrode. Therefore, the important distance is the center-to-center spacing between touch electrodes 18a-1" and 18a-2", rather than the spcing between the closest edges thereof. These reasons allow the sensors to occupy not only a small area, but to have closer spacings, whereby a capacitive touch entry panel having a greater sensor density, i.e. the number of capacitive touch sensors for unit area, is provided.

While the present invention has been described with respect to presently preferred embodiments thereof, many modifications and variations will now become apparent to those skilled in the art. It is our intent, therefore, to be limited only by the scope of the appending claims, rather than by the specific details of the exemplary embodiments described herein.

What is claimed is:

1. A touch entry panel activatible upon contact by a user member, comprising:

a relatively thick insulative substrate having a first surface contactable by user personnel, and a second surface opposite said first surface, with both said surfaces being devoid of operational elements of said panel;

a single member having a single insulative layer with a first surface and a second surface opposite said insulative layer first surface, and having all electrodes of at least one capacitive touch sensor formed completely thereon; each capacitive touch sensor comprising a touch electrode fabricated on said insulative layer first surface and a pair of spaced-apart electrodes fabricated upon the second surface of said insulative layer and in registration with the touch electrode of that sensor;

a terminal associated with each of said spaced-apart electrodes;

lead means fabricated upon said insulative layer second surface for interconnecting each of said spaced-apart electrodes and its associated terminal;

conductive guard means disposed upon said insulative layer first surface and positioned for shielding the lead means of at least one of said at least one capacitive touch sensor from capacitive effects when said substrate first surface is contacted by said user member; and means for fastening said member first surface adjacent to said substrate second surface; said substrate being formed of a material having a dielectric constant sufficiently high enough to cause one of said at least one capacitance touch sensor to be activitated when the user member contacts a portion of the substrate first surface opposite the touch electrode of the capacitive touch sensor to be activated.

2. The touch entry panel of claim 1, wherein said member is a sheet of double-sided printed circuit board having an insulative layer sandwiched between a pair of conductive planes, with the conductive material of each plane being selectively removed to leave conductive areas forming the respective touch and spaced-apart electrodes.

3. The touch entry panel of claim 1, further comprising at least one electronic component mounted on said member; and lead means for interconnecting said at least one electronic component with associated ones of said electrodes and the lead means associated therewith.

4. The touch entry panel of claim 1, wherein said substrate is fabricated of a transparent insulative material.

5. The touch entry panel of claim 4, wherein said substrate is fabricated of glass.

6. The touch entry panel of claim 5, wherein the glass has a dielectric constant of between about 6 and about 8.

7. The touch entry panel of claim 1, wherein each of said touch electrodes is about one-half inch square.

8. The touch entry panel of claim 1, wherein said member has a portion of the area thereof removed for allowing viewing of an object mounted behind the touch entry panel and positioned to be visible through said opening.

* * * * *